(12) United States Patent
Tarantino et al.

(10) Patent No.: US 10,467,517 B2
(45) Date of Patent: Nov. 5, 2019

(54) METHOD FOR PRODUCING A FILM WHICH SERVES AS A CARRIER FOR ELECTRONIC COMPONENTS

(71) Applicant: GIESECKE & DEVRIENT GMBH, München (DE)

(72) Inventors: Thomas Tarantino, Laufen (DE); Robert Griesmeier, Bruckmühl (DE)

(73) Assignee: GIESECKE+DEVRIENT MOBILE SECURITY GMBH, Munich (DE)

( * ) Notice: Subject to any disclaimer, the term of this patent is extended or adjusted under 35 U.S.C. 154(b) by 369 days.

(21) Appl. No.: 15/312,255

(22) PCT Filed: Apr. 21, 2015

(86) PCT No.: PCT/EP2015/000835
§ 371 (c)(1),
(2) Date: Nov. 18, 2016

(87) PCT Pub. No.: WO2015/176792
PCT Pub. Date: Nov. 26, 2015

(65) Prior Publication Data
US 2017/0076192 A1     Mar. 16, 2017

(30) Foreign Application Priority Data

May 21, 2014   (DE) ........................ 10 2014 007 474

(51) Int. Cl.
*G06K 19/077*   (2006.01)
*B32B 37/14*   (2006.01)
(Continued)

(52) U.S. Cl.
CPC ........ *G06K 19/07754* (2013.01); *B32B 37/14* (2013.01); *G06K 19/07722* (2013.01);
(Continued)

(58) Field of Classification Search
CPC ....... G06K 19/07754; G06K 19/07722; H05K 2201/0326; H05K 2201/0323; H05K 3/28;
(Continued)

(56) References Cited

U.S. PATENT DOCUMENTS

| 9,146,017 B2 * | 9/2015 | Van Der Wel ............ F21V 3/06 |
| 2007/0296592 A1 * | 12/2007 | Huang .................. G02F 1/1303 |
| | | 340/572.7 |

(Continued)

FOREIGN PATENT DOCUMENTS

| CA | 2735297 A1 | 3/2010 |
| DE | 19500925 C2 | 4/1999 |

(Continued)

OTHER PUBLICATIONS

German Search Report for corresponding German Application No. DE102014007474.9, dated Apr. 29, 2015.

(Continued)

*Primary Examiner* — Vishal I Patel
(74) *Attorney, Agent, or Firm* — Workman Nydegger

(57) ABSTRACT

A method for producing a foil which serves as a carrier of at least one electronic device and at least one contactless and/or contact-type interface, involves using a transparent foil as a foil and electrical conducting paths on the foil are printed by means of a transparent, electrically conductive material in order to electroconductively connect the electronic device with the interface. Further, the foil can be used for producing a portable data carrier.

10 Claims, 2 Drawing Sheets

(51) Int. Cl.
*H05K 1/02* (2006.01)
*H05K 1/09* (2006.01)
*H05K 1/16* (2006.01)
*H05K 1/18* (2006.01)
*H05K 3/12* (2006.01)
*H05K 3/28* (2006.01)

(52) U.S. Cl.
CPC ............ *H05K 1/0266* (2013.01); *H05K 1/09* (2013.01); *H05K 1/165* (2013.01); *H05K 1/181* (2013.01); *H05K 3/12* (2013.01); *H05K 3/28* (2013.01); *B32B 2307/41* (2013.01); *B32B 2307/412* (2013.01); *B32B 2457/00* (2013.01); *H05K 2201/0323* (2013.01); *H05K 2201/0326* (2013.01); *H05K 2203/06* (2013.01)

(58) Field of Classification Search
CPC .......... H05K 3/12; H05K 1/181; H05K 1/165; H05K 2203/06; H05K 1/0266; H05K 1/09; B32B 2457/00; B32B 2307/412; B32B 2307/41; B32B 37/14
See application file for complete search history.

(56) References Cited

U.S. PATENT DOCUMENTS

2010/0025475 A1\* 2/2010 Webb ...................... B41M 3/14
  235/488
2015/0041546 A1\* 2/2015 Herslow ................ G06K 19/02
  235/492

FOREIGN PATENT DOCUMENTS

| | | |
|---|---|---|
| DE | 19942932 C2 | 1/2002 |
| DE | 60024478 T2 | 8/2006 |
| DE | 102008044809 A1 | 3/2010 |
| DE | 102010053679 A1 | 6/2012 |
| WO | 2001018745 | 3/2001 |
| WO | 2011059151 A1 | 5/2011 |
| WO | 2011069675 A2 | 6/2011 |
| WO | 2013158090 A1 | 10/2013 |
| WO | WO-2013158090 A1 \* | 10/2013 ....... G06K 19/07773 |

OTHER PUBLICATIONS

International Search Report for corresponding International PCT Application PCT/EP2015/000835, dated Jul. 8, 2015.

\* cited by examiner

METHOD FOR PRODUCING A FILM WHICH SERVES AS A CARRIER FOR ELECTRONIC COMPONENTS

BACKGROUND

The invention describes a method for producing a foil which serves as a carrier for electronic devices and a method for producing a portable data carrier having the foil described above.

The production of portable data carriers is known from the prior art. The portable data carriers consist e.g. of several foil layers, which are permanently connected to each other by a lamination method by means of pressure and heat. Electronic devices, such as e.g. an antenna, are applied, for example, on a foil layer before it is laminated with the other foil layers. Chips are integrated, for example, in a module form into a data carrier, by the module being inserted into a recess of the data carrier and, if necessary, connected with an antenna. A contact-type interface, e.g. according to ISO 7816, is usually located on an outer side of the module.

Further, flexible circuit boards into which electronic devices are integrated are known from the prior art. The flexible circuit boards are constructed from different layers, each layer having different electronic devices disposed therein. There are electroconductive connections between the layers for connecting the devices of the different layers into a suitable circuit.

The disadvantage in the prior art is that the integration of electronic devices, such as e.g. chips, displays, sensors, etc. is very complex, because due to their different overall height the devices must be inserted into gaps and the respective gaps penetrate a different number of foil layers. If a module is to be integrated into the data carrier, a respective recess must be produced in the data carrier. In particular the production of recesses is comparatively expensive and time-consuming.

SUMMARY

Starting out from the prior art, it is the object of the invention to find a solution which avoids the above disadvantages.

For achieving the object, the invention discloses a method for producing a foil which serves as a carrier of at least one electronic device and at least one interface, which method is characterized in that
a transparent or opaque foil is used as a foil
and electrical conducting paths on the foil are printed by means of a transparent, electrically conductive material in order to electroconductively connect the electronic device with the interface. As the foil is separately produced as a carrier of at least one electronic device, as a so-called functional overlay, it can be easily integrated into a data carrier or applied onto it, without one having to take care of recesses for electronic devices. Additionally, costs are reduced, because expensive carrier bands for e.g. a chip module are no longer necessary.

An advantageous embodiment example is that at least one electronic device is disposed on the surface of the foil and/or in a depression of the foil. The depression is produced e.g. by means of a laser or by means of an embossing method or another suitable method.

Another advantageous embodiment example is that a contact-type and/or a contactless interface is disposed on the foil.

Another advantageous embodiment example is that the contactless and/or the contact-type interface is printed onto the foil by means of the transparent, electrically conductive material.

Another advantageous embodiment example is that the contact-type interface and the contactless interface are disposed on opposing sides of the foil.

Another advantageous embodiment example is that an interface geometry according to ISO 7816 is used as a contact-type interface.

Another advantageous embodiment example is that an antenna coil is used as a contactless interface.

Another advantageous embodiment example is that indium tin oxide, abbreviated with ITO, or graphene or another suitable material is used as a transparent, electrically conductive material.

Another advantageous embodiment example is that a cover is applied onto the foil side opposing the electronic component, so that the electronic component is not recognizable through the transparent foil.

Another advantageous embodiment example is that a hologram is applied onto the foil as a cover.

Another advantageous embodiment example is that the cover is printed onto the foil.

Another advantageous embodiment example is that the electronic device is printed.

Another advantageous embodiment example is that a chip and/or an electronic display unit and or a sensor and/or a keyboard and/or a resistor and/or a capacitor and/or an inductance is used as an electronic device.

Another advantageous embodiment example is that a foil is used which consists of one or of several layers.

Another advantageous embodiment example is that the foil is produced by means of a roll-to-roll method or by means of a roll-to-sheet method or a sheet-to-sheet method.

Another advantageous embodiment example is that the foil is produced in a sheet format or in a roll format.

For achieving the object, the invention further discloses a foil which was produced according to the above-described method.

In addition, for achieving the object, the invention discloses a method for producing a portable data carrier, which is characterized in that a transparent foil according to the above discussion is disposed onto at least one outer side of the data carrier.

Another advantageous embodiment example is that the transparent foil is disposed onto an inlay.

Another advantageous embodiment example is that the transparent foil and the inlay are permanently connected by means of adhesive or lamination.

Another advantageous embodiment example is that the inlay consists of at least one foil.

Another advantageous embodiment example is that the inlay is opaque.

Another advantageous embodiment example is that the transparent foil is disposed onto an opaque or transparent inlay.

Another advantageous embodiment example is that a motif, e.g. sign, letters, numbers, symbols, pictures, letterings, photos, etc., is printed onto the inlay, which motif can be recognized through the transparent foil from outside. The turns of the antenna coil cannot be recognized here, because they are produced from transparent material.

For achieving the object, the invention finally discloses a data carrier which was manufactured according to the method described above.

BRIEF DESCRIPTION OF THE DRAWINGS

In the following, an embodiment example of the invention is described with reference to the attached Figures.

DETAILED DESCRIPTION OF VARIOUS EMBODIMENTS

Figure 1:
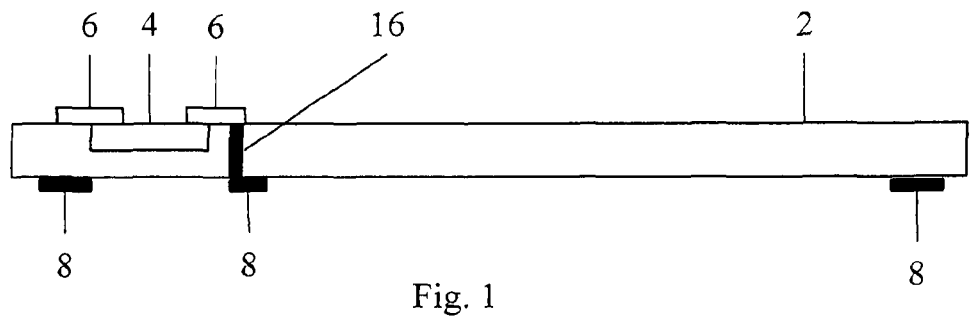
FIG. 1 shows a first embodiment example of a cross section of a foil according to the invention, in which a chip with contact areas according to ISO 7816, an antenna coil and a feedthrough is represented.

FIG. 1 shows a first embodiment example of a cross section of a foil 2 according to the invention, in which a chip 4 with contact areas 6, an antenna coil 8 and a feedthrough 16 is represented. The foil 2 is a transparent foil in which a depression is incorporated on the front side, e.g. by means of a laser, in which the chip 4 is inserted and fastened. The ports (not shown) of the chip 4 are connected with the contact areas 6. The contact areas 6 are e.g. contact areas according to ISO 7816. The chip 4 in FIG. 1 is a chip 4 for a contact-type as well as for a contactless interface. The contact areas 6 serve as a contact-type interface and the antenna coil 8 as a contactless interface. The antenna coil 8 is electroconductively connected with the chip 4 by means of suitable feedthroughs 16. For clarity's sake, only one feedthrough 16 is represented here, for operating the antenna coil 8 at least two feedthroughs 16 being necessary. The feedthrough 16 is produced, by e.g. producing a complete penetration of the foil 2 by means of a laser or a jet of water. Subsequently, the penetration is filled with a conductive material or the side walls of the penetration are coated with the conductive material, the conductive material being connected with a port of the chip for a contactless communication as well as with the antenna coil. For connecting the antenna coil 8 with the ports of the chip 8, the ports C4 and C8 e.g. according to ISO 7816 are used. The antenna coil 8 is printed by means of an electrically conductive transparent material. This has the advantage that when the foil 2 is used as the outermost foil 2 for producing a portable data carrier 18, as shown below in FIG. 4, then the antenna coil 8 is not visible from outside because it consists of transparent material and thus does not disturb the optical impression of a printed inlay foil 14. If a visible antenna coil is not optically disturbing, it can e.g. also be produced by an etching technology or another suitable technology. The foil 2 can be permanently connected with another foil by means of a lamination method as well as by means of an adhesive. Further, the foil 2 can be produced as well as processed by means of a roll-to-roll or a roll-to-sheet method. Alternatively, the foil 2 can also be processed as a sheet.

Figure 2:
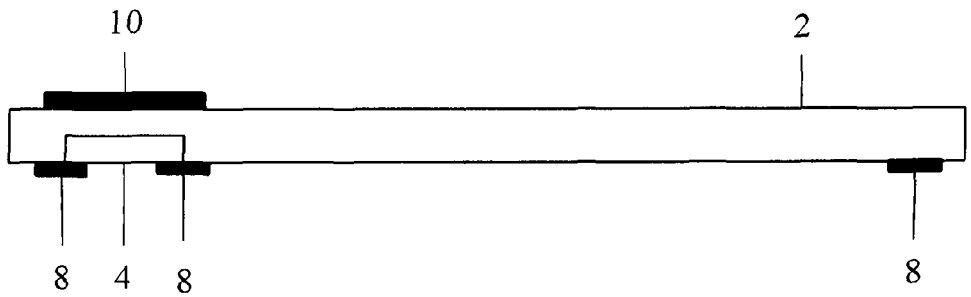
FIG. 2 shows a second embodiment example of a cross section of a foil according to the invention, in which a cover is disposed on the opposing foil side of the chip, so that the chip cannot be recognized from outside.
Figure 4:
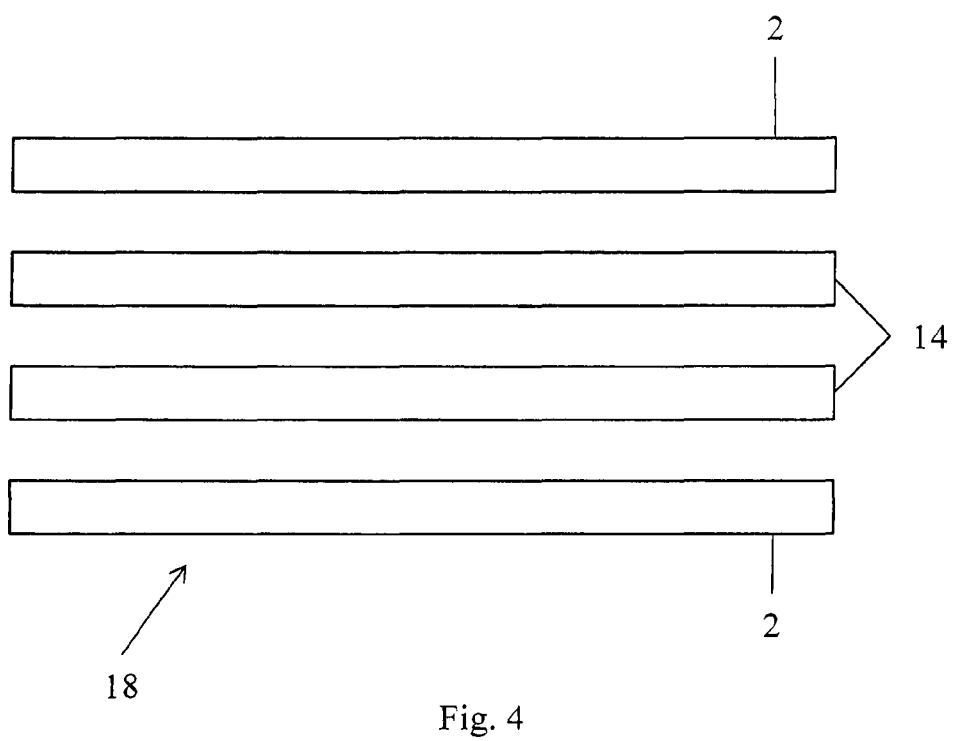
FIG. 4 shows a cross section of the basic construction of a portable data carrier according to the invention, which has a foil according to the invention integrated therein.

FIG. 2 shows a second embodiment example of a foil 2 according to the invention in which a cover 10 is disposed on the opposing foil side of the chip 4, so that the chip 4 is not recognizable from outside. In FIG. 2, for example, the chip 4 is represented with an antenna coil 8 as a contactless interface. Further, in FIG. 2, the chip 4 is disposed on the back side of the foil 2. The back side of the foil 2 is used for connecting the foil 2 with another foil. In order for the chip 4 not to be seen from outside, a cover 10 was applied on the front side of the foil 2 above the chip 4. The cover 10 can e.g. be printed. Alternatively, the cover 10 can be a so-called patch, e.g. an adhesively bonded hologram. The patch can also be applied later onto the finished portable data carrier 18, as it is represented in FIG. 4. This can be carried out, for example, by means of a hologram in the hot stamp method.

Figure 3:
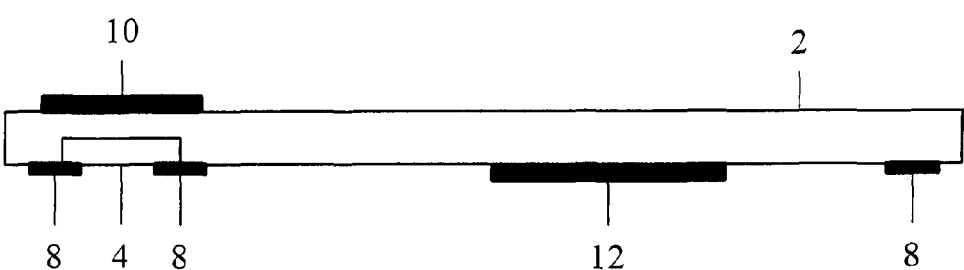
FIG. 3 shows a third embodiment example of a cross section of a foil according to the invention, in which, additionally to the second embodiment example, an additional electronic device, e.g. a display or a sensor, is disposed on the foil.

FIG. 3 shows a third embodiment example of a foil 2 according to the invention in which additionally to the second embodiment example there is disposed an additional electronic device 12, e.g. a display or a sensor, on the foil 2. The additional electronic device 12 can e.g. be printed onto the foil 2 or be inserted into the foil 2 as a discrete device into a depression to be produced. Further, as additional electronic devices 12 there can be disposed e.g. a driver IC for the display, a resistor, a capacity and/or an inductance on the back side of the foil 2. As described in FIG. 4, above the additional electronic device 12 there can also be disposed a cover 10, when it is not a display or another optical display element.

FIG. 4 shows in cross section the basic construction of a portable data carrier 18 according to the invention in which a foil 2 according to the invention is integrated, the foil 2 being represented only basically. The data carrier 18 represented in FIG. 4 consists of two foils 2 according to the invention which are disposed on the outer sides of the data carrier 18, and of two opaque, i.e. light-non-transmissive foils 14, so-called inlays. Alternatively, the data carrier 18 may comprise only one foil 2 according to the invention or several opaque foils 14. The foils 14 have a motif printed on the side connected with the foil 2, the motif not being represented. The motif can be e.g. numbers, letters, symbols, letterings, designs, photos, etc. which is recognizable through the foil 2 from outside. Besides the embodiment example represented in FIG. 4, the data carrier 18 may also comprise more foil layers than represented. Alternatively, the foils 14 can also be transparent, i.e. light-transmissive. Further, both foils 2 or only one foil 2 may be equipped with electronic devices.

LIST OF REFERENCE SIGNS 2 transparent foil according to the invention
4 chip
6 contact areas
8 antenna coil
10 cover
12 additional electronic device, e.g. display, sensor, etc.
14 opaque foil, so-called inlay
16 feedthrough
18 portable data carrier according to the invention

The invention claimed is:

1. A method for producing a foil which serves as a carrier of at least one electronic device and at least one interface, wherein
 a transparent foil is used as a foil,
 wherein electrical conducting paths on the foil are printed by means of a transparent, electrically conductive material in order to electroconductively connect the electronic device with the interface;
 wherein the transparent, electrically conductive material extends through a feedthrough formed in a body of the foil.

2. The method according to claim 1, wherein the at least one electronic device is disposed on the surface of the foil and/or in a depression of the foil.

3. The method according to claim 1, wherein a contact-type and/or a contactless interface is disposed on the foil.

4. The method according to claim 1, wherein the contactless and/or the contact-type interface is printed onto the foil by means of the transparent, electrically conductive material.

5. The method according to claim 1, wherein the contact-type interface and the contactless interface are disposed on opposing sides of the foil.

6. The method according to claim 1, wherein an interface geometry according to ISO 7816 is used as a contact-type interface.

7. The method according to claim 1, wherein an antenna coil is used as a contactless interface.

8. The method according to claim 1, wherein graphene is used as the transparent, electrically conductive material.

9. The method according to claim 1, wherein a cover is applied onto a side of the foil opposing the electronic device, so that the electronic device is not recognizable through the transparent foil.

10. The method according to claim 1, wherein a hologram is applied onto the foil as a cover.

* * * * *